United States Patent [19]

Ozimek et al.

[11] Patent Number: 4,895,291

[45] Date of Patent: Jan. 23, 1990

[54] METHOD OF MAKING A HERMETIC SEAL IN A SOLID-STATE DEVICE

[75] Inventors: Edward J. Ozimek, Penfield; Edward Carnall, Jr., Rochester, both of N.Y.

[73] Assignee: Eastman Kodak Company, Rochester, N.Y.

[21] Appl. No.: 347,091

[22] Filed: May 4, 1989

[51] Int. Cl.$^4$ .................. B23K 1/19; B23K 35/26
[52] U.S. Cl. .................... 228/121; 228/227; 228/263.12
[58] Field of Search ............ 228/121, 123, 124, 193, 228/227, 263.12; 29/841

[56] References Cited

U.S. PATENT DOCUMENTS

| | | | |
|---|---|---|---|
| 3,590,467 | 7/1971 | Chase et al. | 228/121 |
| 3,857,161 | 12/1974 | Hutchins, IV | 228/121 |
| 3,909,917 | 10/1975 | Lebedev et al. | 228/227 |
| 4,020,987 | 5/1977 | Hascoe | 228/56 |
| 4,077,558 | 3/1978 | Carlson et al. | 228/121 |
| 4,159,075 | 6/1979 | Ljung et al. | 228/121 |
| 4,293,986 | 10/1981 | Kobayashi et al. | 228/121 |
| 4,599,538 | 7/1986 | Hidler et al. | 313/512 |
| 4,610,934 | 9/1986 | Boecker et al. | 228/263.12 |
| 4,750,665 | 6/1988 | Falanga | 228/123 |
| 4,836,434 | 6/1989 | Takenaka et al. | 228/121 |

*Primary Examiner*—Nicholas P. Godici
*Assistant Examiner*—Samuel M. Heinrich
*Attorney, Agent, or Firm*—Donald D. Schaper

[57] ABSTRACT

A method of making a hermetic seal for a solid-state device is disclosed. The device includes a ceramic housing having a cavity for an element such as an image sensor. A cover formed of a transparent material is sealed to the housing to close the cavity. A metallization support is formed on the cover and on the housing. In order to form a hermetic seal at a relative low temperature, a layer of indium is coated on the metallization support of either the cover or the housing, and a layer of tin is coated on the support of the other of the two parts. The cover is then placed on the housing, and the parts are placed in a furnace where a temperature under the melting temperature of the composite alloy of tin and indium is maintained for a period long enough to diffuse the tin and indium together. The temperature is then raised to a temperature sufficient to melt the alloy, and the device is then slowly cooled to ambient temperature.

9 Claims, 2 Drawing Sheets

FIG. 1
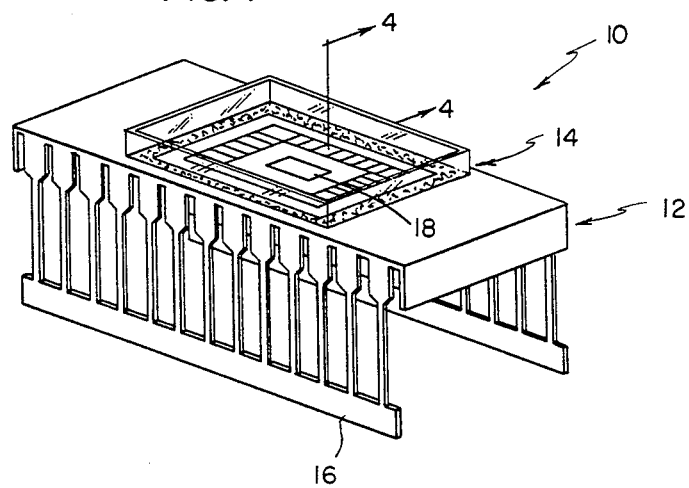
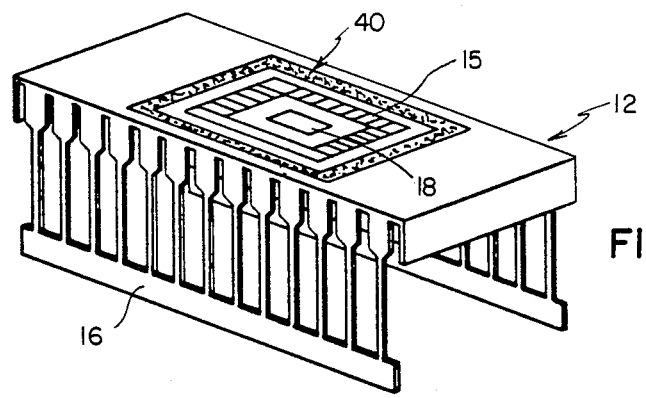
FIG. 2
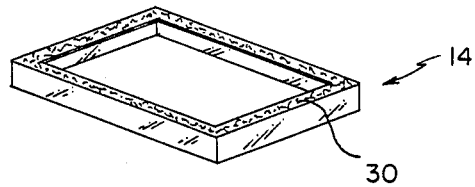
FIG. 3

METHOD OF MAKING A HERMETIC SEAL IN A SOLID-STATE DEVICE

BACKGROUND OF THE INVENTION

1. Field of the Invention

This invention relates to a method of forming a hermetic seal, and more particularly, to a method of making a hermetic seal for electronic image sensor packages.

2. Background of the Prior Art

In the packaging of solid-state devices, a semiconductor chip is typically mounted within a cavity formed in a ceramic housing, and a cover is sealed to the housing to close the cavity. In U.S. Pat. No. 4,750,665, there is disclosed a method of producing a semiconductor package in which a ceramic cover is joined to a ceramic housing using a gold-tin solder paste. When the solder has been applied and the cover and housing have been assembled together, they are heated to a temperature of about 350° C. to form a bond between the parts. There is a problem in using such a process in the packaging of semiconductor devices which contain some types of image sensors. Certain image sensors include color filter arrays and lenslets which are formed of organic materials, and the temperatures used to melt the solder in the patented process can cause degradation of the organic materials.

Epoxy materials have been used to seal the packages of solid-state devices containing image sensors in order to avoid the high temperatures used in sealing semiconductor packages with solder. The epoxys, however, do not form a hermetic seal, and thus, they are not suitable for some applications. For example, solid-state devices used in military applications must meet the requirements set forth in a military specification, Mil-Std-833C, in which the packages must be able to withstand pressurized tests.

It is known in the prior art to bond crystals together using low-melting-point alloys and pressure fusing under relatively low temperatures. In U.S. Pat. No. 4,077,558, to Carlson et al., there is disclosed a method of bonding two crystal components together to form an acousto-optic device. A bond enhancing material, such as Cr, is coated on one crystal, and a layer of noble metal, such as gold, is then deposited on the bond enhancing material. On the other crystal, a low-melting-point metal, such as tin or indium, is coated on the crystal, and then a noble metal is coated over the low-melting-point metal. The two noble metal layers are then brought together at a temperature of 100°–200° C. and at a pressure of at least 50 psi. The low-melting-point material will diffuse into the noble metals and across the interface, causing a bond to form by elimination of the boundary between the crystals. Although the highest temperatures used in this process are somewhat lower than in the patent discussed above, the temperatures are still too high to prevent damage to the image sensors. The most serious drawback, however, to the process disclosed in the Carlson et al. patent is the very high pressures which must be applied to cause the diffusion of the noble metal and the low melting point alloy. Such high pressures could not be used to seal semiconductor packages.

SUMMARY OF THE INVENTION

It is an object of the present invention to overcome the problems disclosed in the prior art discussed above and to provide an improved method of sealing a semiconductor package.

In accordance with one aspect of the present invention, there is provided a method of making a hermetic seal in a solid-state device, the method comprising: forming a metallization support on a housing; forming a metallization support on a cover for the housing; forming a layer of indium on one of the supports; forming a layer of tin on the other of the supports; positioning the cover and the housing such that the layers of indium and tin are in contact with each other; heating the cover and housing to a temperature of between about 70% and about 90% of the melting temperature of a composite alloy of tin and indium to diffuse the tin and indium together; heating the cover and housing to a temperature sufficient to melt the alloy after the diffusion is complete; and slowly cooling the cover and housing to ambient temperature.

In one embodiment of the present invention a method is disclosed for making a hermetic seal between a transparent cover made of a material such as quartz and a housing which is made of a ceramic material. The housing is adapted to receive an image sensor and to support the image sensor such that the sensor can be irradiated through the transparent cover. A metallization support is formed around the periphery of each of the parts to be joined. The top layer of the metallization support is a material such as gold which is formed over a base layer of nickel, titanium, tungsten, or chromium. The metallization supports are then cleaned, and at least one layer of indium or tin is plated on the clean surface of each of the supports. The top layer is indium for one of the parts, for example the cover, and the top layer is tin for the other part, for example the housing. The cover and the housing are then positioned together and placed in a furnace. A very light pressure is applied, and diffusion of the materials is enhanced thermally by maintaining a temperature of approximately 80% of the melting temperature of a composite alloy of indium and tin. Once the diffusion process is complete, the temperature is raised above 125° C. to melt the alloy. The furnace is then cooled slowly to ambient temperature.

A principal advantage of the present invention is that a hermetic seal can be formed between a transparent cover and a ceramic housing at a very low pressure and relatively low temperature. Thus, an image sensor contained in the housing will not be damaged in the process of forming a seal. A further advantage of the disclosed process is that long curing times are not required and the process is relatively inexpensive.

Other features and advantages will become apparent upon reference to the following description of the preferred embodiment when read in light of the attached drawings.

BRIEF DESCRIPTION OF THE DRAWINGS

FIG. 1 is a perspective view of a semiconductor package formed according to the present invention;

FIG. 2 is a perspective view of the housing and showing an image sensor mounted within the housing;

FIG. 3 is a perspective view of a cover showing a sealing pad formed thereon.

DESCRIPTION OF THE PREFERRED EMBODIMENT

Figure 4:
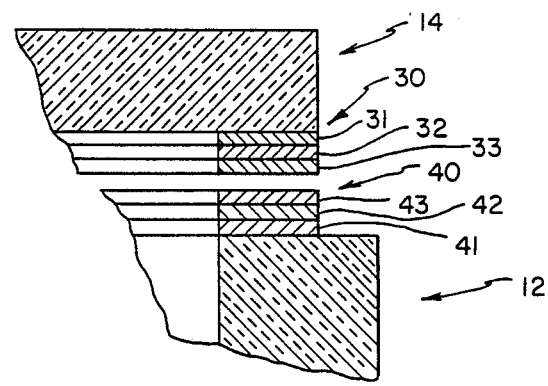
FIG. 4 is a partial sectional view showing the layers of the sealing pads formed on the cover and housing.

With reference to FIG. 1, there is shown a solid-state device 10 of a type which is sealed in accordance with the process of the present invention. Device 10 comprises a housing 12 and a cover 14. Housing 12 can be formed of a ceramic material, for example, alumina. Leads 16 extend from housing 12 and are joined to an image sensor 18 which is contained within a cavity 15 in housing 12. Image sensor 18 can be of a type which includes a convex lens surface for each pixel, as disclosed, for example, in U.S. Pat. No. 4,694,185, granted Sept. 15, 1987. This patent is assigned to the assignee of the present invention.

Cover 14 is made of a transparent material such as glass, quartz, sapphire, or a transparent ceramic. A sealing pad 30 is formed on cover 14. Sealing pad 30 is formed from a plurality of layers, as shown in FIG. 4. The layers shown in FIG. 4 have been enlarged for purposes of illustration, and they are not shown to scale. Sealing pad 30 comprises a metallization support which consists of a layer 31 of nickel, chromium, or a titanium-tungsten alloy deposited on the cover 14, and a gold-layer 32 which is coated over layer 31. Layer 31 is for bond enhancing or adhesion purposes, and the gold layer 32 is added to prevent oxidation. After the metallization support is formed, the surface thereof is cleaned using a plasma etch (500 watts r.f.; 300 mm oxygen; 30 minutes) or a u.v. ozone method can be used. After the cleaning step, a top layer 33 of either indium or tin is formed on the gold layer 32. Alternating layers of indium and tin (not shown) can also be used over the gold layer.

As shown in FIG. 2, a sealing pad 40 is formed on the housing 12. The sealing pad 40 includes a metallization support which is generally similar to the metallization support for pad 30 and consists of a base layer 41 (FIG. 4) of nickel, chromium, or tungsten, and a gold layer 42 deposited over the base layer. The support is then cleaned by a plasma etch as described above. A top layer 43 of indium or tin is then formed on the gold layer 42, or alternating layers of indium and tin are deposited on layer 42.

A necessary element of the invention is that each of the top layers 33 and 43 for cover 14 and housing 12, respectively, must be either indium or tin, and the top layer 33 must be of a different material from the material of top layer 43. Thus, for example, the top layer 33 for cover 14 could be tin, and the top layer 43 for the housing 12 could be indium. An electroless technique can be used for plating the sealing pads on the cover 14 and housing 12, or a tank plating method can be used. The total thickness of the platings is controlled by the number of layers. The total thickness of sealing pads 30 and 40 can be about 1 mil (0.001 inch), individual layers of about 0.1 mil can be used.

When sealing pads 30 and 40 have been formed, the surfaces of the pads are cleaned chemically by a freon TF (trichlorofluoroethane) solvent and by etching in a 50% hydrochloric acid solution for a few minutes. Cover 14 and housing 12 are then positioned together with pad 30 superimposed over pad 40, and they are placed in a vacuum (or an inert atmosphere) furnace (not shown). Diffusion of the materials is enhanced thermally by maintaining a temperature in the furnace of approximately 80% of the melting temperature of the composite alloy. For indium and tin, the furnace is maintained at a temperature of about 100° C. during the diffusing step. Once the diffusion process is complete, the temperature is raised above 125° C. to alloy melting of the alloy. The furnace is then cooled slowly to ambient temperature over a period of about two hours. The total package can then be removed for testing.

In one illustrative example of the present invention, the housing was a standard 24 pin DIP housing, obtained from NTK Co., Springfield, New Jersey. A metallization support was formed on the housing which included a base layer of tungsten and a gold layer deposited on the tungsten. The tungsten layer was screen printed on the housing, and the gold layer was deposited on the tungsten using an electroless technique. The cover was a glass cover, obtained from Glass Specialty Company, Willow Grove, Pa. A metallization support was formed on the glass cover which included a base layer of a titanium-tungsten alloy containing about 10% titanium and about 90% tungsten and a gold layer deposited on the alloy. The titanium-tungsten alloy was deposited on the cover by vacuum deposition, and the gold layer was deposited on the alloy using an evaporation technique. The surfaces of the two metallization supports were cleaned chemically and etched in a plasma.

After the support surfaces were cleaned, alternating layers of In, Sn, In were deposited on the metallization support of the housing using a swab plating process, and alternating layers of Sn, In, and Sn were deposited on the cover metallization support using the swab plating process. The thickness of each of the metallization supports was about 0.005 mil. The thickness of each of the Sn and the In layers on the housing and the cover was measured using a Cyberscan 100 non-contacting optical profiler, and each of the layers was found to be about 0.1 mil. Thus, the total thickness of the sealing pad on the housing was about 0.35 mil, and the total thickness of the sealing pad on the cover was also about 0.35 mil.

The surfaces of the sealing pads were cleaned chemically be a freon TF (trichlorofluoroethane) solvent and by etching in a 50% hydrochloric acid solution for a few minutes. The cover was then placed on the housing with the sealing pad of the cover superposed over the sealing pad of the housing, and the parts were clamped together using a custom clip having a clamping force of about one pound. This assembly was placed in a vacuum oven and heated at 100° C. for four hours to diffuse the tin and indium together. After the diffusing step, the assembly was heated in the vacuum oven to a temperature of 130° C. for 10 minutes, and the assembly was then allowed to return slowly to room temperature. The completed device was tested for fine and gross leaks and was found to be in accordance with the standards prescribed in MIL STD 883C.

The invention has been described in detail with particular reference to a preferred embodiment thereof, but it will be understood that variations and modifications can be effected within the spirit and scope of the invention.

We claim:
1. A method of making a hermetic seal in a solid-state device, said method comprising the steps of:
    forming a metallization support on a housing;
    forming a metallization support on a cover for said housing;
    forming a layer of indium on one of said supports;
    forming a layer of tin on the other of said supports;

positioning said cover and said housing such that said layers of indium and tin are in contact with each other;

heating said cover and housing to a temperature of between about 70% and about 90% of the melting temperature of a composite alloy of tin and indium to diffuse said tin and indium together;

heating said cover and housing to a temperature sufficient to melt said alloy after said diffusion is complete; and slowly cooling the cover and housing to ambient temperature.

2. A method, as defined in claim 1, wherein each of said supports includes a layer of nickel and a layer of gold thereon.

3. A method, as defined in claim 1, wherein said metallization supports are cleaned using a plasma etch prior to being coated with a layer of indium or tin.

4. A method, as defined in claim 1, wherein said melting temperature of the composite alloy is about 125° C.

5. A method, as defined in claim 5, wherein said cover and housing are heated to a temperature of 100° C. to diffuse said tin and indium together.

6. A method, as defined in claim 1, wherein said housing is formed of a ceramic material.

7. A method, as defined in claim 1, wherein said cover is transparent.

8. A method, as defined in claim 1, wherein alternating layers of indium and tin are formed on each of said supports, and a top layer on said one support is indium and a top layer on said other support is tin.

9. A method of making a hermetic seal in a solid-state device, said method comprising:

forming a metallization support on a housing, said support having a base layer of tungsten and a gold layer deposited on the tungsten layer;

forming a metallization support on a cover for said housing, said support having a base layer of a titanium-tungsten alloy and a gold layer deposited on the alloy;

forming alternating layers of indium and tin on one of said supports, the top layer on said one support being indium;

forming alternating layers of tin and indium on the other of said supports, the top layer on said other support being tin;

positioning said cover and said housing such that said top layers of indium and tin are in contact with each other;

heating said cover and housing to a temperature of about 100° C. for about four hours to diffuse said tin and indium together;

heating said cover and housing to a temperature of about 130° C. for about 10 minutes; and slowly cooling the cover and housing to ambient temperature.

* * * * *